(12) United States Patent
Confalonieri et al.

(10) Patent No.: US 7,283,005 B2
(45) Date of Patent: Oct. 16, 2007

(54) CLOCK-PULSE GENERATOR CIRCUIT

(75) Inventors: Pierangelo Confalonieri, Caponago (IT); Marco Zamprogno, Cesano Maderno (IT); Angelo Nagari, Cilavegna (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 68 days.

(21) Appl. No.: 11/055,539

(22) Filed: Feb. 9, 2005

(65) Prior Publication Data

US 2005/0231293 A1 Oct. 20, 2005

(30) Foreign Application Priority Data

Feb. 10, 2004 (EP) .................. 04425083
Feb. 18, 2004 (EP) .................. 04425100

(51) Int. Cl.
*H03K 3/03* (2006.01)

(52) U.S. Cl. ........................... 331/57; 331/2

(58) Field of Classification Search .................. 331/57, 331/2

See application file for complete search history.

(56) References Cited

U.S. PATENT DOCUMENTS

| | | | |
|---|---|---|---|
| 4,550,405 A | 10/1985 | West ................. | 371/1 |
| 4,565,976 A | 1/1986 | Campbell ........... | 331/57 |
| 4,893,095 A | 1/1990 | Thommen ........... | 331/57 |
| 5,038,118 A | 8/1991 | Langenkamp ....... | 331/57 |
| 5,357,204 A | 10/1994 | Knoll ................. | 328/62 |
| 5,416,436 A | 5/1995 | Rainard .............. | 327/270 |
| 5,592,126 A * | 1/1997 | Boudewijns et al. ......... | 331/45 |
| 5,841,707 A | 11/1998 | Cline et al. .......... | 365/194 |
| 5,923,715 A | 7/1999 | Ono ................... | 375/376 |
| 6,060,930 A | 5/2000 | Choi | |

(Continued)

FOREIGN PATENT DOCUMENTS

| | | |
|---|---|---|
| EP | 0 901 226 A2 | 3/1999 |
| JP | 62-76317 | 4/1987 |

(Continued)

OTHER PUBLICATIONS

U. Tietze, Ch. Schenk, "Helbleiter-Schaltungstechnik 10.Auflage," *Springer Verlag* 561846, pp. 232-236, 1993. XP002288569.

(Continued)

*Primary Examiner*—Joseph Chang
(74) *Attorney, Agent, or Firm*—Lisa K. Jorgenson; Timothy L. Boller; Seed IP Law Group PLLC

(57) ABSTRACT

The circuit comprises a first ring oscillator comprising an odd number of inverting elements, a delay element and an output terminal; the delay element responds to a pulse at its input with a predetermined time delay with respect to a predetermined edge of the input pulse and substantially without time delay with respect to the other edge of the input pulse. With a view to avoiding start-up transients and generating pulses with a duty cycle that can be easily modified, the circuit comprises a second ring oscillator, having an output terminal connected to the output terminal of the first oscillator, and a bistable logic circuit having an output terminal connected to the common output of the first and the second oscillator. At least one of the inverting elements of the first oscillator and at least one of the inverting elements of the second oscillator form part of the bistable logic circuit.

27 Claims, 10 Drawing Sheets

U.S. PATENT DOCUMENTS

| | | |
|---|---|---|
| 6,229,367 B1 | 5/2001 | Choudhury ................. 327/276 |
| 6,362,694 B1 | 3/2002 | Doberenz ................... 331/57 |
| 6,373,342 B1 | 4/2002 | Tran .......................... 331/57 |
| 6,388,490 B2 | 5/2002 | Saeki ......................... 327/270 |
| 6,603,339 B2 | 8/2003 | Atallah et al. .............. 327/175 |
| 2002/0027465 A1 | 3/2002 | Yoshikawa ................. 327/277 |
| 2005/0231293 A1 | 10/2005 | Confalonieri et al. ........ 331/57 |
| 2005/0231412 A1 | 10/2005 | Confalonieri et al. ....... 341/155 |

FOREIGN PATENT DOCUMENTS

| | | |
|---|---|---|
| JP | 5-304441 | 11/1993 |
| JP | 8-102643 | 4/1996 |

OTHER PUBLICATIONS

U.S. Appl. No. 11/055,564, filed Feb. 9, 2005, Confalonieri et al.

* cited by examiner

CLOCK-PULSE GENERATOR CIRCUIT

BACKGROUND OF THE INVENTION

1. Field of the Invention

The present disclosure relates in general to timing circuits and, more particularly, to a clock-pulse generator.

2. Description of the Related Art

A clock-pulse generator frequently utilized in digital circuits is the oscillator shown in FIG. 1. It consists of an odd number of inverter elements connected to each other in the form of a ring and having a given input capacitance. A node H of the ring is connected to an output buffer, in this example another inverter, whose output OUT is the output of the generator. Given its input capacitance, each inverter constitutes a delay cell. With a view to permitting the activation and deactivation of the generator, the circuit is provided with an electronic switch M, in this example an N-channel MOS transistor, connected between the node H and ground and controlled by a signal RES that can assume either one or the other of two voltage values, typically those of the supply source of the circuit, corresponding to the logic states 0 and 1. When the switch is closed (RES=1), the generator is deactivated and the output OUT is in the logic state 0 (OUT=0). When the switch is open (RES=0), the oscillator can function and on the output (OUT) of the buffer there forms a train of pulses that, in the steady state, vary between 0 and 1 with a period 2n*dt, where n is the number of inverters in the ring and dt is the propagation delay of one cell. The duty cycle of the pulse train is typically 50% and is not easy to modify. This circuit has the drawback that, when the oscillator is started, its output, prior to attaining steady conditions, is subject to a transient during which both the amplitude and the frequency of the pulse train will vary. Consequently, whenever the output OUT has to be used for operations that call for the steady state oscillation frequency, one necessarily has to wait for the end of the transient.

FIG. 2 illustrates another known oscillator that comprises an odd number of inverting logic elements and a delay element connect in the form of a ring. The delay element is made in such a manner as to respond to a pulse at its input with a predetermined delay Δt with respect to the trailing edge of the input pulse and practically without delay with respect to the leading edge of this input pulse. A node H' of the ring is connected to an output buffer, once again an inverter in this example, whose output is the output OUT of the generator. In order to permit activation and deactivation of the oscillator, the circuit is again provided with an electronic switch, an N-channel MOS transistor again indicated by M, connected between the node H' and ground and controlled by a signal RES as in the circuit of FIG. 1. By this circuit, when a signal RES=0 causes transistor M to block, the oscillation begins practically without transients, so that the output OUT can be used immediately. As a general rule, however, the output signal has a very asymmetric duty cycle, because the time in which it is in the state 1 and the time in which it is in the state 0 are determined by delays that, in the greater part of practical applications, are very different from each other; in fact, we are here concerned with a relatively long delay due to the delay element and a relatively short delay deriving from the sum of the very brief switching delays of the inverters. The delay of the delay element can be easily modified, but that of the inverters is practically invariable, so that the duty cycle can be set to about 50% only for very high oscillation frequencies.

BRIEF SUMMARY OF THE INVENTION

In one aspect, an embodiment of the present invention makes available a clock-pulse generator circuit that is devoid of start-up transients and produces clock pulses with a duty cycle that can easily be set to any desired value.

In another aspect, a clock-pulse generator comprises: a first ring oscillator comprising an odd number of inverting elements, a first delay element and an output terminal, the first delay element being capable of responding to a pulse at its input with a time delay with respect to an edge of the input pulse and substantially without time delay with respect to the other edge of the input pulse; a second ring oscillator comprising an odd number of inverting elements, a second delay element and an output terminal connected to the output terminal of the first oscillator, the second delay element being capable of responding to a pulse at its input with a time delay with respect to an edge of the input pulse and substantially without delay time with respect to the other edge of the input pulse; and a bistable logic circuit having an output terminal connected to the output terminals of the first and the second oscillators, wherein at least one of the inverting elements of the first oscillator and at least one of the inverting elements of the second oscillator form part of the bistable logic circuit.

In another aspect, a clock-pulse generator comprises: a first ring oscillator having first means for delaying a signal; a second ring oscillator coupled to the first ring oscillator and having second means for delaying a signal; and a bi-stable logic coupled to the first and second ring oscillators.

In another aspect, an integrated circuit comprises: a first ring oscillator having a first delay logic; and a second ring oscillator having a second delay logic, wherein the first and second ring oscillators are coupled together through a bi-stable logic.

In another aspect, a method of generating a clock pulse, comprises: coupling an output of a bistable logic to an input of a first delay element through a first loop; coupling the output of the bistable logic to an input of a second delay element through a second loop; enabling the first delay element and the second delay element; applying an output signal from the first delay element to a first input of the bistable logic; and applying an output signal from the second delay element to a second input of the bistable logic.

BRIEF DESCRIPTION OF THE SEVERAL VIEWS OF THE DRAWINGS

The invention will be more readily understood from the following detailed description of particular embodiments and some variants thereof, the description making reference to the attached drawings, of which

DETAILED DESCRIPTION OF THE INVENTION

Figure 1:
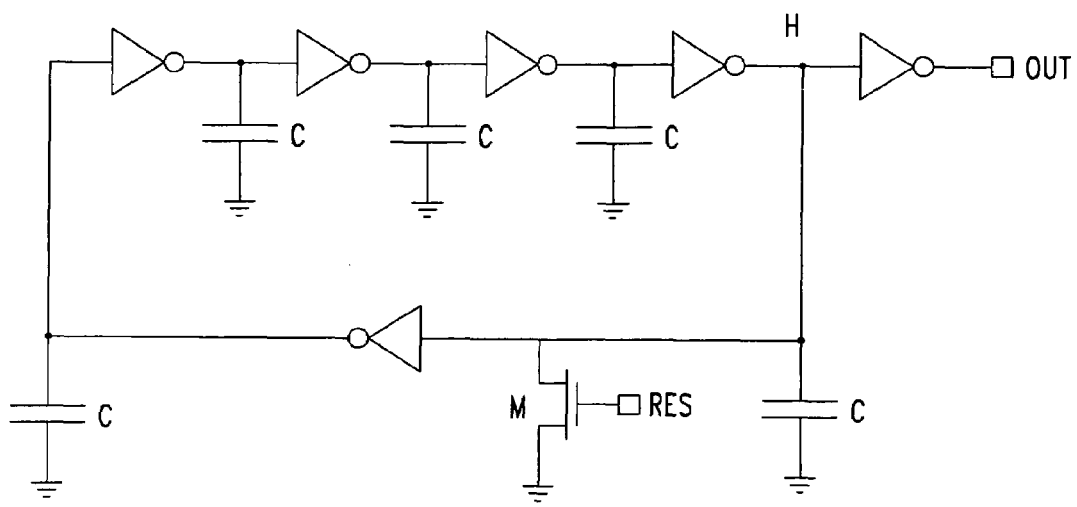
FIG. 1 is a schematic block diagram of a known oscillator.
Figure 2:
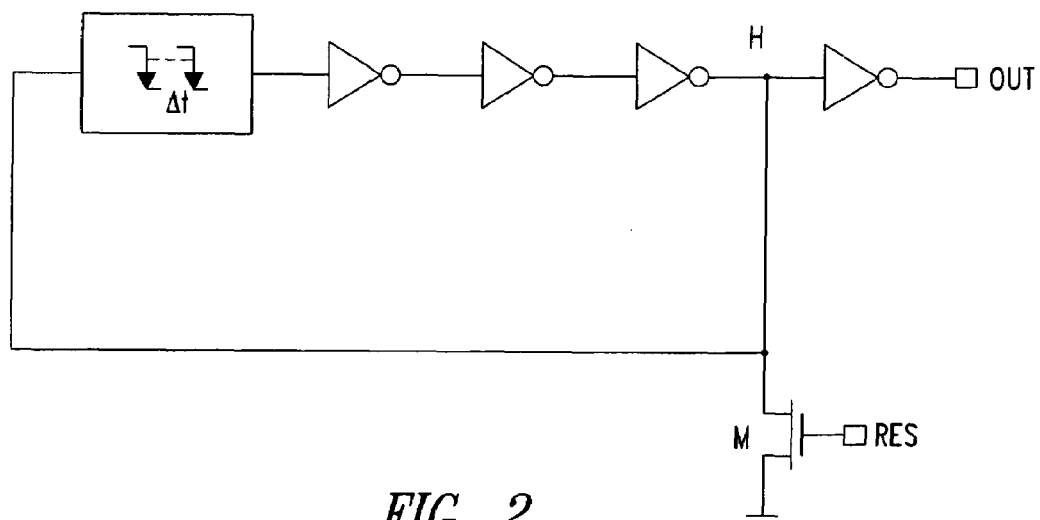
FIG. 2 is a schematic block diagram of another known oscillator.
Figure 3:
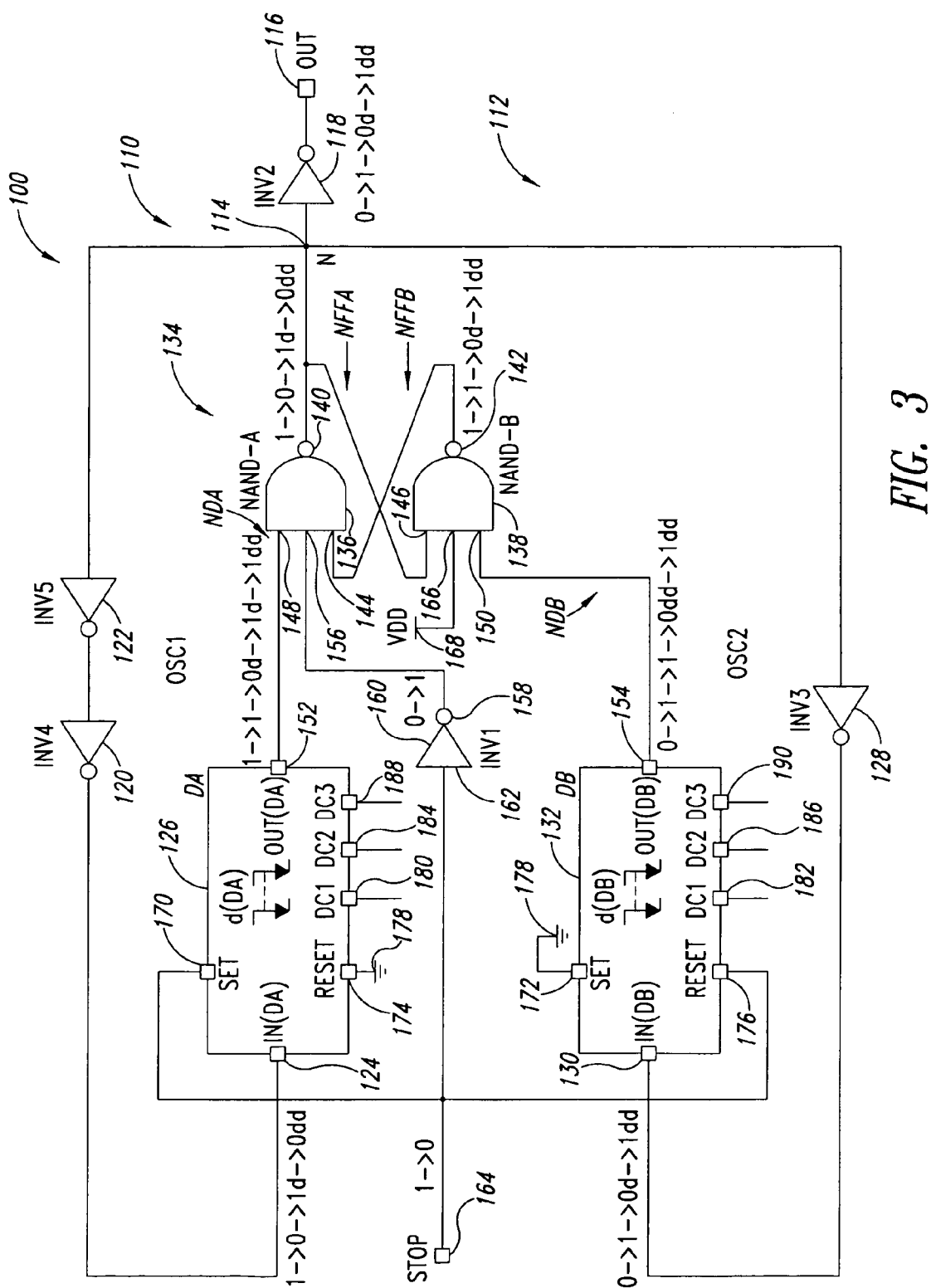
FIG. 3 is a schematic block diagram of a clock-pulse generator in accordance with one embodiment of the invention.

Referring to FIG. 3, a pulse generator 100 in accordance with an embodiment of the invention comprises two ring oscillators OSC1 110 and OSC2 112 having a common node N 114 connected to the output terminal OUT 116 of the pulse generator 100 via a buffer 118 that, in this particular example, is an inverter INV2. The oscillator OSC1 110 comprises two inverters INV4 120 and INV5 122 connected in cascade betweenthe node N 114 and the input IN9(DA) 124 of a delay element DA 126, in this example of a type capable of responding to an input pulse with a predetermined delay d(DA) with respect to the trailing edge of the input pulse and practically without delay with respect to the leading edge of this between the node N 114 and the input IN(DB) 130 of another delay element DB 132 that is similar to the delay element DA 126. The pulse generator 100 also comprises a bistable logic circuit 134, such as a flip-flop, formed in this example by two NAND logic gated, indicated by NAND-A 136 and NAND-B 138, coupled to the two oscillators 110, 112 in such a way as to constitute an inverting element for one of the rings and two inverting elements for the other. More particularly, in the illustrated embodiment, the gate NAND-A 136 has its output 140 connected to the common node N 114 and the two gates 136, 138 have their respective outputs 140, 142 each connected to a respective input 146, 144 of the other NAND gate and each has another input 148, 150 connected to the output 152, 154 of, respectively, the delay element DA 126 and the delay element DB 132; consequently, the flip-flop 134 closes the ring of the oscillator OSC1 110 with one inverting element whenever it is in one of its two stable states and closes the ring of the oscillator OSC2 112 with two inverting elements whenever it is in the other of its two stable states. The flip-flop 134 has a habilitation terminal constituted by a third input 156 of the gate NAND-A 136. This third input 156 is connected to the output 158 of an inverter INV1 160 that has its input 162 connected to an activation/deactivation control terminal 164, indicated by STOP. The gate NAND-B 138 has a third input 166 connected to a terminal 168 to which there can be applied a fixed voltage, for example the supply voltage VDD, so that it will always be in the logic state 1.

Each of the two delay elements DA 126 and DB 132 has a respective activation terminal 170, 172, indicated by SET, and a deactivation terminal 174, 176, indicated by RESET, that serve to force the respective outputs 152, 154 to 1 or to 0; more particularly, the output of one delay element is stable at the logic value 0 when the terminal RESET is at the logic value 1 or is stable at the logic value 1 when the terminal SET is at the logic value 1. In this example, the terminal SET 170 of DA 126 and the terminal RESET 176 of DB 132 are connected to the activation/deactivation terminal STOP 164 and the terminal SET 172 of DB 132 and the terminal RESET 174 of DA 126 are connected to ground 178, so that, whenever STOP=1, the output of DA is stable at 1 and the output of DB is stable at 0, while, whenever STOP=0, both the output of DA and the output of DB depend on the state of their respective inputs. In the illustrated embodiment, each of the two delay elements DA 126 and DB 132 also has three other inputs, indicated by DC1 180, 182, DC2 184, 186, and DC3 188, 190, which serve to set the delay, as will be explained in detail further on in this description. It is clear that, in general principle, the delays of the elements DA 126 and DB 132 may differ from each other.

Figure 4:
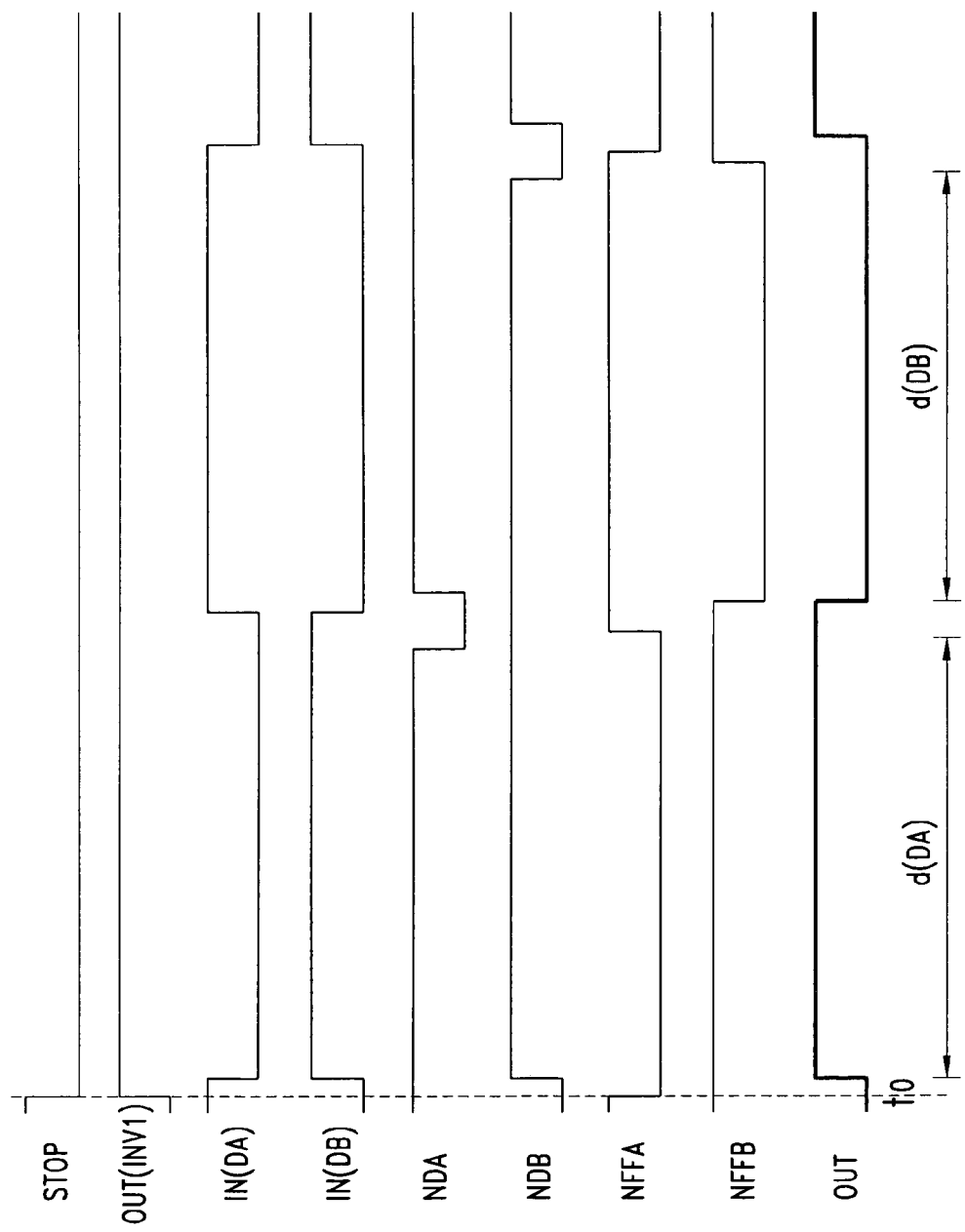
FIG. 4 shows some waveforms that illustrate the functioning of the embodiment of FIG. 3.

Let us now consider the functioning of the pulse generator 100 circuit of FIG. 3 with reference to the waveforms of FIG. 4, bearing in mind that the time relationships between the various waveforms shown in FIG. 4 are only indicative, because not all the delays associated with the various elements of the circuit have been taken into consideration in a rigorous manner. With a view to facilitating comprehension of the functioning, the logic states (0,1) of the principal nodes of the circuit are shown in succession, possibly followed by one or more letters "d" to indicate the delayed change of state.

The circuit becomes activated when the binary signal STOP changes state, passing from 1 to 0. For as long as STOP=1, the output 152 NDA of the retarder element DA 126 is equal to 1, because SET=1, the output NDB 154 of the delay element DB 132 is equal to 0, because RESET=1, the output NFFA 140 of the gate NAND-A 136 is equal to 1, because at least one of its two inputs, the one 156 connected to the output 158 of the inverter INV1 160, is equal to 0, the output NFFB 142 of the gate NAND-B 138 is equal to 1, because at least one of its two inputs, the one 150 connected to the output 154 of the delay element DB 132, is at 0, and the output OUT 116 of the oscillator is equal to 0.

When STOP switches from 1 to 0 at the instant to, the two delay elements DA 126 and DB 132 are habilitated or enabled to respond to the signals applied to their respective inputs IN(DA) 124 and IN(DB)130. It should be noted that, before STOP switches from 1 to 0, the input IN(DA) 124, due to the double inversion of the signal present on NFFA, is equal to 1 and the input IN(DB) 130, due to the inversion of the signal present on NFFA, is equal to 0. As soon as STOP=0, the output of INV1 158 (OUT(INV1)) switches from 0 to 1, so that the inputs 144, 148, 156 of NAND-A 136 are all at 1 (NFFB=1 and NDA remains unchanged at 1 for a period of time determined by the delay element DA 126), the output 140 of NAND-A 136, i.e., NFFA, switches from 1 to 0 and the output OUT 116 switches from 0 to 1. The input IN(DA) 124 switches from 1 to 0, the input IN(DB) 130 of DB 132 switches from 0 to 1. The output 154 of DB 132, i.e., NDB, switches from 0 to 1 after a brief delay with respect to the leading edge of the input signal IN(DB) and the output NFFB 142 remains at 1 (because at least one of its inputs, the one 146 connected to NFFA, is equal to 0). After a period of time equal to the delay d(DA) of DA 126, the output NDA of DA 126 switches from 1 to 0, so that the output NFFA of NAND-A 136 switches from 0 to 1, the output NFFB of NAND-B 138 switches from 1 to 0, because its inputs are now all at 1 (NDB remains equal to 1 for a period of time d(DB) determined by the cell DB), OUT switches from 1 to 0, the input IN(DA) of DA switches from 0 to 1 and the output NDA of DA, which has just passed to 0, returns to 1 after a very brief period of time, because the delay of DA on the leading edge of the input is very brief, the input IN(DB) of DB switches from 1 to 0, while the output NDB remains at 1 for the whole of the delay time d(DB). When the delay d(DB) comes to an end, NDB switches to 0, NFFB switches to 1, NFFA switches to 0 (because the inputs of the gate NAND-A are now all at 1), OUT switches to 1, the input IN(DA) of DA switches to 0 and NDA remains at 1, the input IN(DB) of DB switches from 0 to 1, while the output NDB returns to 1 with the brief delay associated with the leading edge of the input signal. The network is now in the same conditions in which it was just after the instant $t_0$ (at the beginning of the delay d(DA))

and continues to oscillate between the two states 0 and 1 for as long as STOP remains equal to 0. As soon as STOP switches from 0 to 1, the output NDA of the delay element DA switches to 1 and remains there and output NDB switches to 0 and remains there, so that we once again have the situation illustrated at the beginning of the description of the functioning of the circuit.

It should be noted that, if the oscillation is to be assured, all that is necessary is that the delay introduced by the two inverters INV4 120 and INV5 122, or the delay introduced by the inverter INV3 128, summed with the brief delay of one cell (DA or DB) with respect to the leading edge of a pulse at its input (switch from 0 to 1), should be greater than the switching time of the flip-flop.

The circuit of FIG. 3 responds to an activation signal (STOP=0) by causing the output 116 to switch (from 0 to 1) and generating, without start-up transients, clock pulses of the pre-established period and duty cycle. The period is determined by the sum of the delays (d(DA)+d(DB)) of the delay elements DA 126 and DB 132 and the duty cycle is determined by the ratio between one of the two delays and the sum of the two delays.

Figure 5:
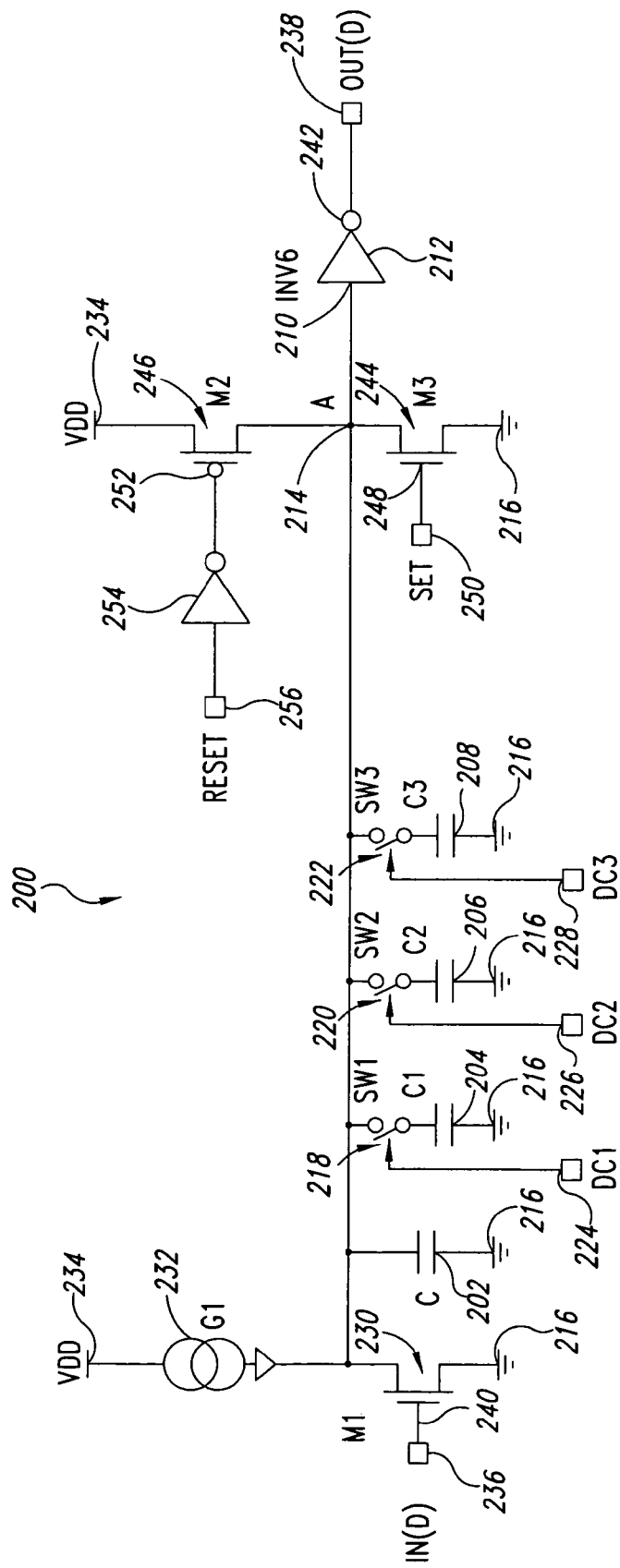
FIG. 5 is a schematic block diagram of a known delay element suitable for use in the embodiment of FIG. 3.

The delay elements may be circuits that respond to a predetermined edge of a binary input signal, that is to say, to a transition from one predetermined state of the two binary logic states to the other, with a delay that is a function of the ratio between a capacitance C and a current I. A known delay element 200 of this type, in which the transition from 1 to 0 is delayed and in which this delay can be adjusted, is schematically illustrated by FIG. 5. It comprises a group of capacitors 202, 204, 206, 208 (four in this example, but they could also be more or less than four) connected, or capable of being connected, to the input A 210 of an inverter INV6 212. The capacitors 202, 204, 206, 208 are connected between the node A 214 and ground 216; more precisely, one of them, indicated by C 202, is connected directly between the node A and ground and the other three, indicated by C1 204, C2 206, C3 208, can be connected to the node A 214 via respective electronic switches SW1 218, SW2 220 and SW3 222 controlled by binary logic signals applied to respective control terminals DC1 224, DC2 226, DC3 228. An N-channel MOS transistor, indicated by M1 230, and a constant current generator G1 232 connected in series with each other between the terminals of the supply source (ground 216 and VDD 234) make it possible to control the charge of the capacitors 202, 204, 206, 208. The input terminal IN(D) 236 and the output terminal OUT(D) 238 of the delay circuit 200 are, respectively, the control or gate terminal 240 of the transistor M1 230 and the output terminal 242 of the inverter INV6 212. The node A 214, via an N-channel MOS transistor 244, indicated by M3, is also connected to ground 216, and, via a P-channel MOS transistor 246, indicated by M2, to the supply terminal VDD 234. The gate terminal 248 of the transistor M3 244 is connected to an activation terminal SET 250 of the delay circuit 200 and the gate terminal 252 of the transistor M2 246, via an inverter 254, is connected to a deactivation terminal RESET 256 of the delay circuit 200.

According to a likewise known variant (not illustrated) of the delay circuit of FIG. 5, the constant current generator G1 232 is replaced by a resistor, so that the delay is a function of the product of the resistance of the resistor multiplied by the capacitance of the capacitors 202, 204, 206, 208 connected to the input 210 of the inverter 212.

Referring to the circuit of FIG. 5, let us first consider the case in which SET=0 and RESET=0, i.e., the case in which both M3 244 and M2 246 are not conducting. When IN(D) =1, the transistor M1 230 conducts, so that the node A 214 is substantially at ground potential (binary state 0), the capacitors (i.e., 202, 204, 206, 208) connected to the node A 214 are discharged and, due to the effect of the inverter INV6 212, the output 238 OUT(D) of the delay circuit is a positive voltage, typically the supply voltage VDD (binary state 1). When the input signal IN(D) passes from 0 to 1, the transistor Ml 230 ceases to conduct and the capacitors 202, 204, 206, 208 begin to charge through the generator G1 232. When the voltage at the node A 214 attains the switching threshold voltage of the inverter INV6 212, the output 238 OUT(D) of the delay circuit 200 passes from the supply voltage VDD to ground potential. The time that elapses between the moment when the signal IN passes from 1 to 0 and the switching instant of the inverter, i.e., the delay time of the circuit 200, obviously depends on the threshold voltage of the inverter 212. The delay time may be modified by closing or opening one or more of the switches SW1 218, SW2 220, SW3 222 connecting the capacitors C1 204, C2 206, C3 208 to ground 216 by means of signals applied to DC1 224, DC2 226, DC3 228. The output OUT(D) 238 of the delay circuit 200 may be forced to 1 or to 0 by using the alternative settings of RESET=0 and SET=1 or RESET=1 and SET=0.

The inverter INV6 212 typically consists of two complementary MOS transistors (i.e., an N-channel transistor and a P-channel transistor) that have their drain terminals in common and their source terminals connected, respectively, to the ground terminal 216 and the positive terminal VDD 234 of the supply source. In this case the threshold voltage depends on the supply voltage VDD, the threshold voltages of the transistors and the mobility of the charge carriers (electrons and vacancies) in the transistors. The supply voltage VDD may be fixed with a good degree of precision (+/−1%) at a nominal value established in the design phase, but the threshold voltages of the transistors and the mobility of the charge carriers cannot be accurately fixed, because they depend on manufacturing parameters, which may vary within relatively wide limits, and depend also on the operating temperature, which—in its turn—depends on the operating conditions of the device in which the time-delay circuit is integrated. With a view to avoiding these difficulties, use may be made of the circuit shown in FIG. 6, which is based on a solution idea described in European Patent Application No. 4425083.5 filed on 10 Feb. 2004 under the title "Delay-time circuit".

Figure 6A:
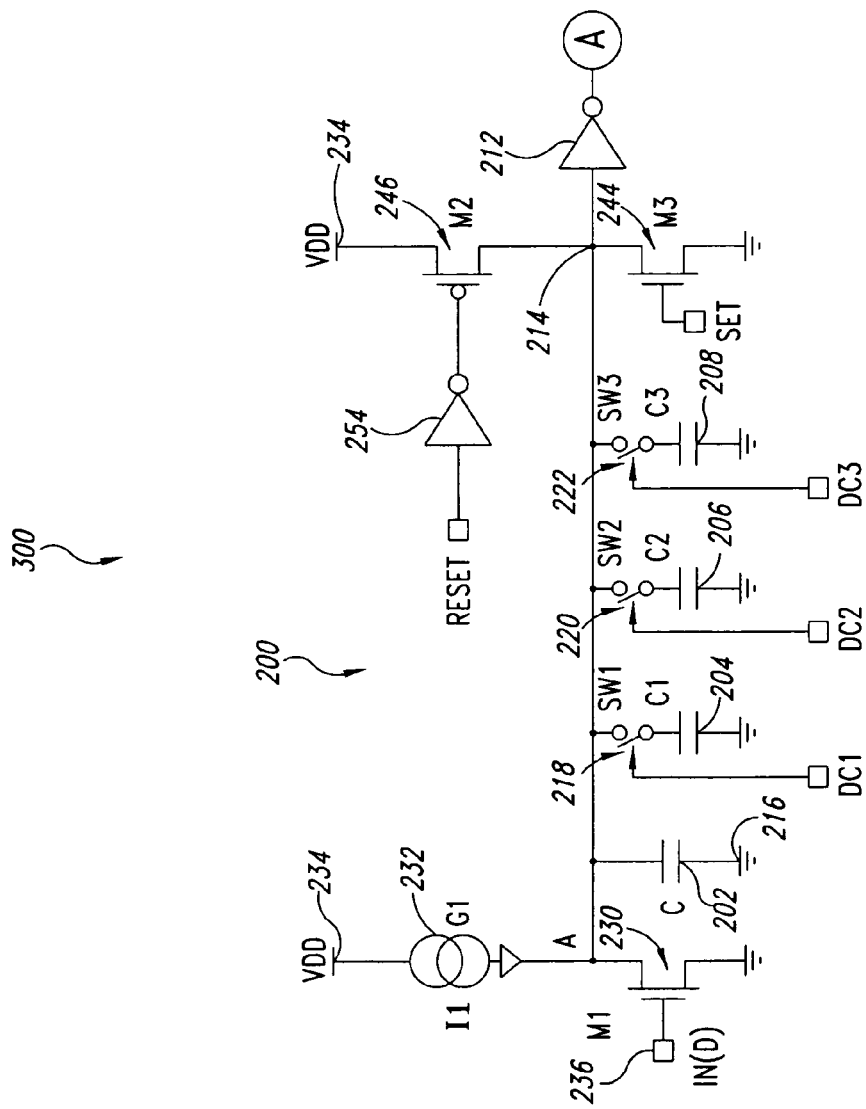
FIGS. 6A and 6B are a schematic block diagram of another embodiment of a delay element.
Figure 6B:
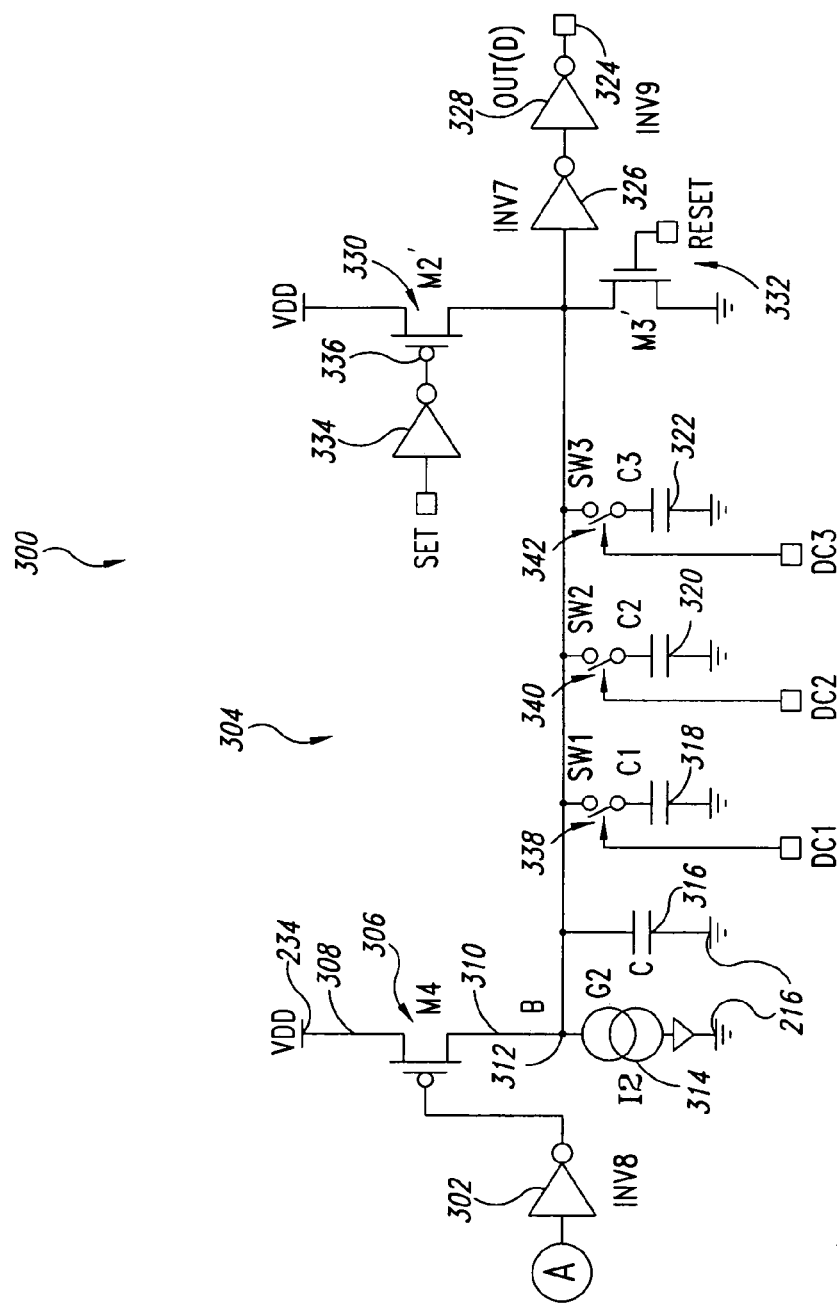

The delay element 300 shown in FIGS. 6A and 6B (collectively, FIG. 6) comprises an input stage 200 similar to the circuit of FIG. 5, that is coupled, by means of an inverter INV8 302, to a second stage 304 that comprises a dual or complimentary circuit of the one of FIG. 5. More particularly, the second stage 304 comprises a P-channel MOS transistor 306, indicated by M4, having its source terminal 308 connected to the positive terminal VDD 234 of the supply source and its drain terminal 310 (node B 312) connected, via a constant current generator G2 314, to the negative terminal 216 of the supply source, i.e., the ground terminal. The node B 312 is connected to ground via an array of capacitors 316, 318, 320, 322, that are equal to the capacitors of the input stage, and to the output terminal OUT(D) 324 of the circuit 300 via two inverters INV7 326 and INV9 328 in cascade. Two complementary MOS transistors M2' 330 and M3' 332, equal to the transistors M2 246 and M3 244 of the first stage 200, are connected to the node B 312 to perform the same function as the transistors M2 246 and M3 244, with the sole difference that the signals SET and RESET are swapped. An inverter 334 is coupled to the control terminal or gate 336 of transistor M2' 330. The delay time may be modified by closing or opening one or more of the switches 338, 340, 342 coupling the capacitors 318, 320, 322 to the node B 312.

When the input terminal IN(D) 236 is equal to 1 (with SET=0 and RESET=0), the transistor M1 230 is conducting, the node A 214 is at 0, the capacitors (i.e., 202, 204, 206, 208) connected to the node A are discharged, the output of the inverter INV6 212 is at 1, the output of the inverter INV8 302 is at 0, the transistor M4 306 is conducting, the node B 312 is at 1, the capacitors (i.e., 316, 318, 320, 322) connected to the node B 312 are charged at the voltage VDD, the output of the inverter INV7 326 is at 0 and the output OUT(D) 324 is at 1. When the input IN(D) 236 switches from 1 to 0, i.e., when M1 230 passes from conducting to blocking, the current I1 of the generator G1 232 charges the capacitors (i.e., 202, 204, 206, 208) connected to the node A 214, causing the voltage of the node A 214 to rise linearly (VA=I1*t/C1), where t is the time and CA is the capacitance of the capacitors). When, following a time Δt1, the threshold voltage of the inverter INV6 212 is attained, the output of the inverter INV6 212 switches from 1 to 0, the output of the inverter INV8 302 switches from 0 to 1, the transistor M4 306 switches to blocking and the capacitors (i.e., 316, 318, 320, 322) connected to the node B 312 become linearly discharged (VB=VDD−I2*t/CB, where t is the time, CB is the capacitance of the capacitors and I2 is the current of the generator G2 314). When, following a time Δt2, the node B 312 reaches the threshold voltage of the inverter INV7 326, the latter switches from 0 to 1 and the output OUT(D) 324 switches from 1 to 0. The time Δt that elapses between the moment the signal IN(D) 236 changes from 1 to 0 and the switching of the inverter INV9 328 is the delay time of the circuit 300 and is substantially given by the sum of the two delays Δt1 and Δt2, i.e., the sum of the time that is needed for the current I1 to charge the capacitors connected to the node A 214 from 0 (ground potential) to the threshold voltage Vth(INV6) of the inverter INV6 212 and the time that is needed for the current I2 to discharge the capacitors connected to the node B 312 from the voltage VDD to the threshold voltage Vth(INV7) of the inverter INV7 326. When the circuit 300 is designed in such a manner that I1=I2=I, CA=CB=C, Vth (INV6)=Vth(INV7), the total delay time of the circuit is determined solely by the time needed for a constant current I to charge a capacitor of capacitance C from 0 to VDD. The delay time is thus independent of the threshold voltage of the inverters and therefore insensitive to the variations deriving from the manufacturing process and the temperature. There remains the dependence on the supply voltage, but, as already mentioned, this can easily be maintained at a substantially constant nominal value.

The conditions of equality indicated above can be obtained with a good degree of precision. The generators G1 and G2 may, for example, be constituted by branches of respective equal current mirrors that mirror a fixed reference current independent of the temperature and the inverters may be constituted by identical components, since they are of the same size and are made by means of the same manufacturing process. The same result may, as a general rule, be obtained with different current generators, capacitors and inverters, provided that the equalities I1/CA=I2/CB and Vth(INV6)=Vth(INV7) are substantially satisfied.

The inverter INV9 328 serves for obtaining at the output terminal a clock signal having the same sign as the input signal. When a clock signal of the opposite sign is desired, this inverter may be omitted: in that case the output of the circuit coincides with the output of the inverter INV7 326.

A dual circuit (not here illustrated) of the one shown in FIG. 6 utilizes a P-channel MOS transistor rather than an N-channel MOS transistor and an N-channel MOS transistor rather than a P-Channel MOS transistor; these transistors have their respective source terminals connected to the supply terminals dual to those of the corresponding transistors of the circuit of FIG. 6. With this configuration the delay time Δt of the output is relative to the leading edge of the input signal rather than the trailing edge. The functioning of this circuit is analogous to the functioning of the circuit 300 of FIG. 6, for which reason it will not here be further described.

The circuit 300 of FIG. 6 and its dual can be modified, as already noted in relation to the circuit of FIG. 5, by including two resistors in place of the constant current generators G1 and G2. In this case, once again, the delay time will be given by the sum of the delay times of the two stages, each of which is a function of the respective resistances and capacitances.

Figure 7A:
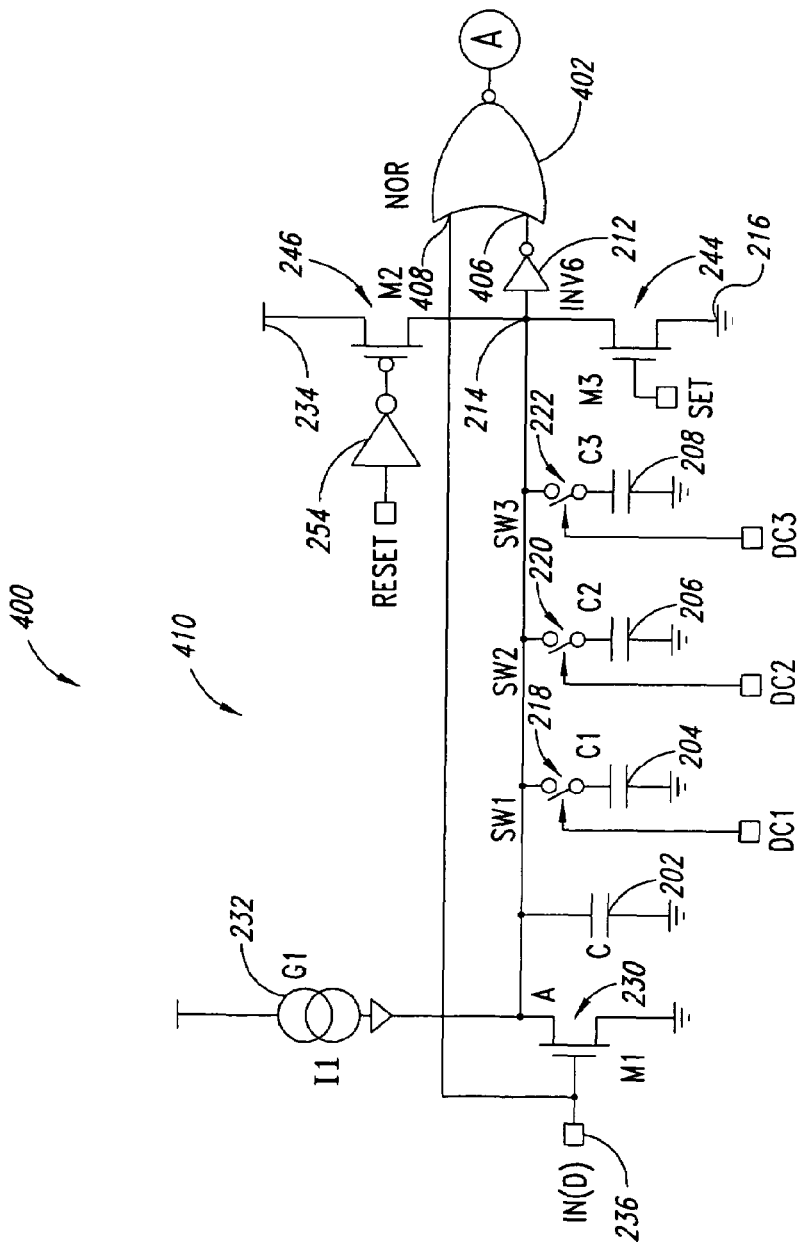
FIG. 7A and 7B are a schematic block diagram of another embodiment of a delay element.
Figure 7B:
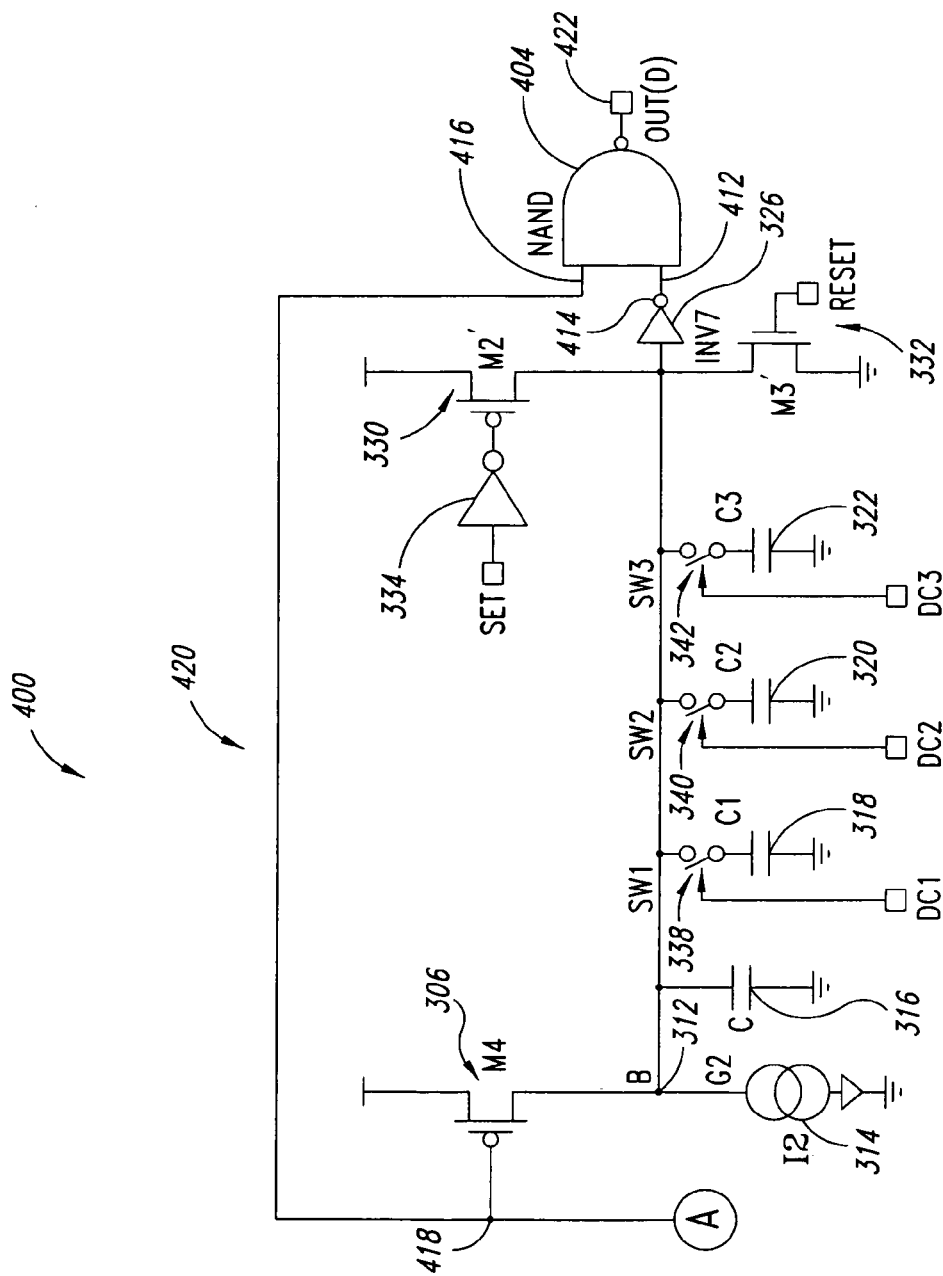

FIGS. 7A and 7B (collectively FIG. 7) show a variant 400 of the delay-time circuit of FIG. 6 that reduces noise that the oscillator containing the delay-time circuit may induce in the supply voltages. It is well known that an oscillator realized in an integrated circuit that contains analog circuits can cause interference in the supply voltages of the analog circuits. This interference is proportional to the currents in play. The delay time of each of the delay elements utilized in the oscillator may be the briefest possible at a predetermined edge of the input pulse. Once the capacitance of the capacitors has been fixed, a reduction of this delay time can be achieved by diminishing the resistance in conduction of the transistors (M1, M4) through which the capacitors are discharged. However, a low resistance implies a large discharge current and therefore considerable interference. The variant of the delay-time circuit shown in FIG. 7 maintains the resistance of the transistors at a relatively high value, thus avoiding high current peaks, while yet obtaining brief delay time.

The circuit of FIG. 7 differs from the one of FIG. 6 by virtue of the fact that the place of the inverters INV8 and INV9 is taken by, respectively, a NOR gate 402 and a NAND gate 404. The NOR gate 402 has a first input 406 connected to the output of the inverter INV6 212 and a second input 408 connected to the input 236 of the first stage 410, i.e., the input terminal IN(D) 236 of the circuit 400. The NAND gate 404 has a first input 412 connected to the output 414 of the inverter INV7 326 and a second input 416 connected to the input 418 of the second stage 420, i.e., the gate terminal of the transistor M4 306. As regards the functioning, when IN(D) 236 switches to 1, the transistor M1 230 goes from blocking to conducting, so that the capacitors (i.e., 202, 204, 206, 208) connected to the node A 214 begin to discharge through it. Before the discharge is completed, however, the switching of the input signal forces the output OUT(D) 422 to 1. In fact, the logic constituted by the NOR gate 402 and the NAND gate 404 transmits the switching of the input to the output before the capacitors become charged/discharged. The discharging/charging processes should be concluded in a time shorter than the half-period of the oscillation.

Figure 8A:
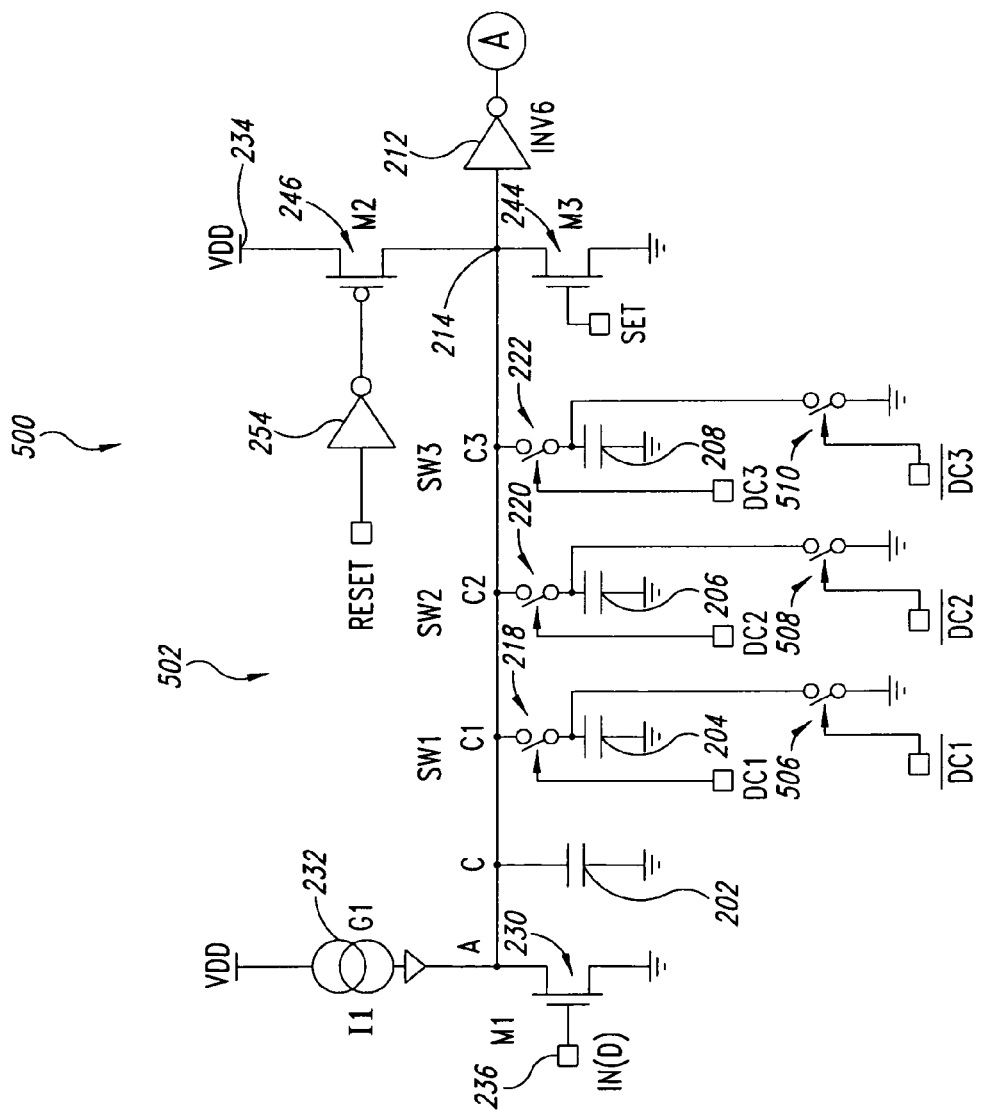
FIGS. 8A and 8B are a schematic block diagram of another embodiment of a delay element.
Figure 8B:
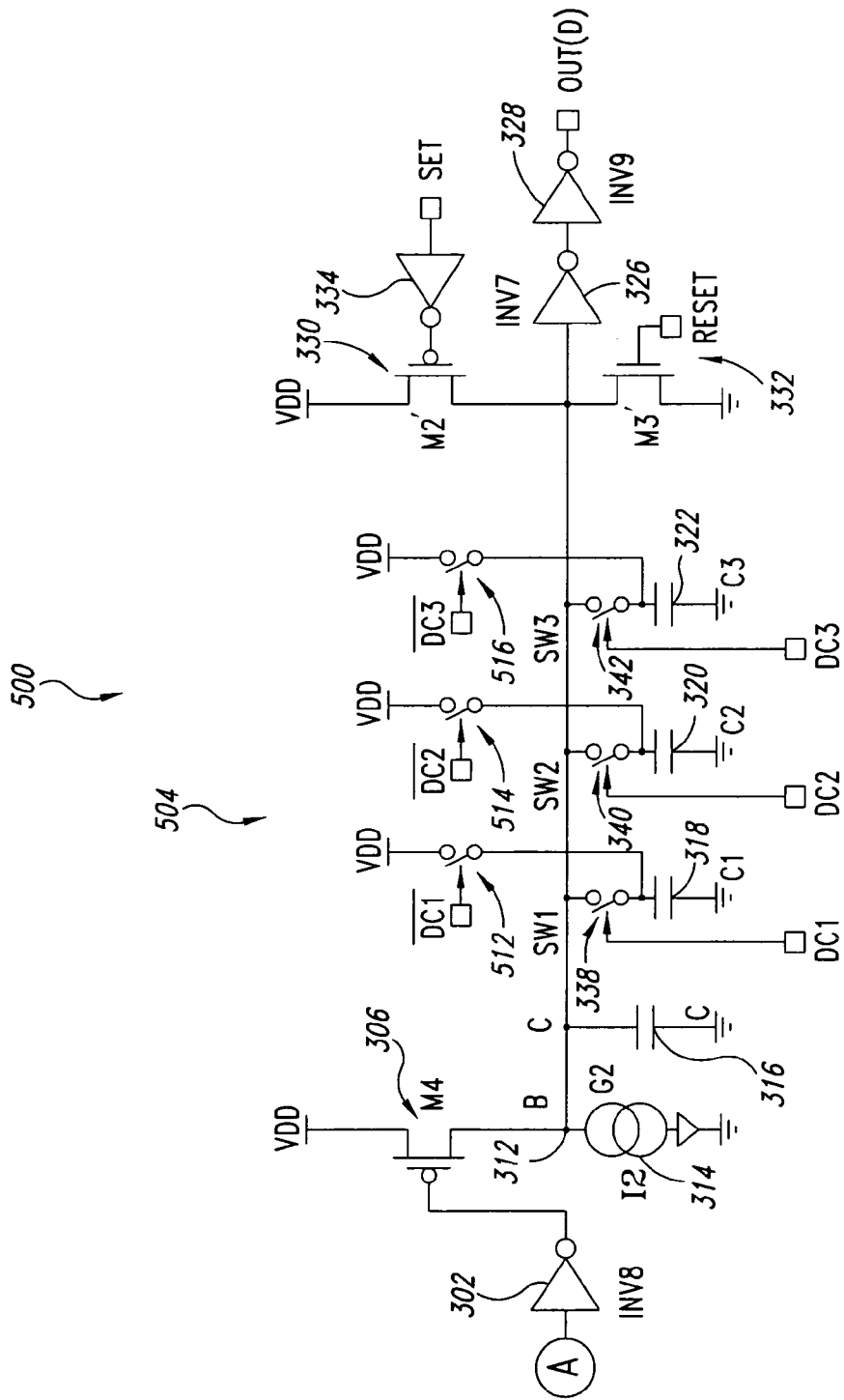

FIG. 8 shows a variant 500 of the delay-time circuit of FIG. 6 that facilitates modifying the duty cycle and or the period of the output signal during the functioning of the generator. If the contribution of each capacitor is to be the same whenever the respective electronic switch is closed, initial charging conditions should be the same. Consequently, the capacitors of the input stage 502 (i.e., 202, 204, 206, 208) are maintained at ground potential when they are not connected to the node A 214 and the capacitors of the output stage 504 (i.e., 316, 318, 320, 322) are maintained at VDD when they are not connected to the node B 312, utilizing electronic switches 506, 508, 510, 512, 514, 516 controlled by the negated values of the binary signal DC1, DC2, DC3. The variants illustrated in FIGS. 7 and 8 may be combined and dual or complementary variants may be employed.

Embodiments of the clock-pulse generator circuit in accordance with the invention may produce an oscillation that can be utilized as soon as the oscillator is started, because it is not affected by transient phenomena. When it is brought to a halt (STOP=1), in fact, it stops in a known condition, that is to say, all its nodes always assume the same predetermined binary values; consequently, when it is re-started (STOP=0), it begins with an oscillation of the correct value right from the first half-period.

In a particular embodiment of the invention the circuit generates clock pulses having a period and a duty cycle substantially independent of the variations due to the manufacturing process of the integrated circuit and the operating temperature.

According to another embodiment of the invention, the generator may be realized in such a manner as to avoid high current peaks and suitable for being used with advantage in integrated circuits in which it is desired to avoid the risk of inducing noise in the supply voltages.

Furthermore, both the period and the duty cycle of the output signal of the generator in some embodiments may be modified within wide limits. This adjustment is possible even while the generator is in operation.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A clock-pulse generator, comprising:
a first ring oscillator comprising an odd number of inverting elements, a first delay element and an output terminal, the first delay element being capable of responding to a pulse at its input with a time delay with respect to an edge of the input pulse and substantially without time delay with respect to the other edge of the input pulse;
a second ring oscillator comprising an odd number of inverting elements, a second delay element and an output terminal connected to the output terminal of the first oscillator, the second delay element being capable of responding to a pulse at its input with a time delay with respect to an edge of the input pulse and substantially without delay time with respect to the other edge of the input pulse; and
a bistable logic circuit having an output terminal connected to the output terminals of the first and the second oscillators, wherein at least one of the inverting elements of the first oscillator and at least one of the inverting elements of the second oscillator form part of the bistable logic circuit.

2. A clock-pulse generator in accordance with claim 1 wherein at least one of the first and second delay elements comprises means for adjusting the respective time delay.

3. A clock-pulse generator in accordance with claim 1 wherein each of the first and second delay elements comprises setting means capable of stably maintaining a respective output in a predetermined binary state, said setting means being such that they can be activated and deactivated with a respective digital signal.

4. A clock-pulse generator in accordance with claim 3, wherein the setting means comprises two electronic switches capable of connecting an input terminal of an inverter to a first or a second voltage reference terminal in response to digital signals applied to respective activation/deactivation terminals.

5. A clock-pulse generator in accordance with claim 1 wherein the bistable logic circuit comprises an activation/deactivation terminal.

6. A clock-pulse generator in accordance with claim 1, wherein the bistable logic circuit has an input terminal coupled to an output terminal of the first delay element and a second input terminal coupled to an output terminal of the second delay element.

7. A clock pulse generation in accordance with claim 1 wherein a time-delay of the first delay element is a predetermined time delay with respect to a predetermined edge of the respective input pulse and a time-delay of the second delay element is a predetermined time delay with respect to a predetermined edge of the respective input pulse.

8. A clock-pulse generator in accordance with claim 1 wherein the first and second delay elements each comprise:
an input terminal and an output terminal;
a first inverter having a particular switching threshold voltage;
capacitive means coupled to an input terminal of the first inverter;
means for controlling a charge of the capacitive means capable of responding to a predetermined edge of an input pulse applied to the input of the respective delay element to bring the input terminal of the first inverter from a first predetermined voltage to the switching threshold voltage and obtain at an output terminal of the first inverter a pulse having an edge that, with respect to the predetermined edge of the input pulse, has a first time delay that depends on the switching threshold voltage; and
means for modifying a capacitance of the capacitive means as a function of signals applied to respective adjustment inputs of the respective delay element.

9. A clock-pulse generator in accordance with claim 8 wherein the first and second delay elements each comprise a stage having an input terminal coupled with the output terminal of the respective first inverter and an output terminal coupled with the output terminal of the respective delay element, said stage comprising:
a second inverter having a switching threshold voltage substantially equal to that of the first inverter and an output terminal coupled to the output terminal of the stage:
further capacitive means coupled to an input terminal of the second inverter; and
means for controlling a charge of the further capacitive means capable of responding to a delayed edge of a pulse present at the output terminal of the first inverter to bring the input terminal of the second inverter from a second predetermined voltage to the switching threshold voltage and obtain on the output terminal of the second inverter a pulse having an edge that, with respect to the delayed edge of the output pulse of the first inverter, has a second time delay that depends on the switching threshold voltage, an overall time delay of the delay element being the sum of the first and the second time delay.

10. A clock-pulse generator in accordance with claim 8 wherein the means for modifying the capacitance of the capacitive means comprise a multiplicity of capacitors and a multiplicity of electronic switches each connected in series with one of the capacitors and controlled by the signals applied to the respective adjustment inputs.

11. A clock-pulse generator in accordance with claim 9 wherein each of the delay elements comprises logic by-pass means configured to transmit to the output a switch from one logic state to the other of an input pulse in a time less than a half-period of oscillation.

12. A clock-pulse generator, comprising:
a first ring oscillator having first means for delaying a signal comprising a first delay stage having first capacitance means and a second delay stage coupled to the first delay stage through a first logic gate and comprising second capacitance means, wherein the first capacitance means comprises a plurality of capacitors selectively coupled to a first node through a corresponding first plurality of switches;
a second ring oscillator coupled to the first ring oscillator and having second means for delaying a signal; and
a bi-stable logic coupled to the first and second ring oscillators.

13. The clock-pulse generator of claim 12 wherein the bi-stable logic comprises a flip-flop.

14. The clock-pulse generator of claim 12 wherein the bi-stable logic is configured as an inverting element for the first ring oscillator and as two inverting elements for the second ring oscillator.

15. The clock-pulse generator of claim 12 wherein:
the first delay stage further comprises a plurality of transistors; and
the second delay stage further comprises a plurality of complementary transistors.

16. The clock-pulse generator of claim 12 wherein the logic gate is a NOR gate.

17. The clock-pulse generator of claim 12 wherein the plurality of capacitors are selectively coupled to a first reference voltage through a corresponding second plurality of switches.

18. An integrated circuit, comprising:
a first ring oscillator having a first delay logic with a first activation/deactivation terminal;
a second ring oscillator having a second delay logic with a second activation/deactivation terminal; and a bi-stable logic coupling together the first and second ring oscillators and configured to produce a clock pulse at an output, the bi-stable logic having an activation/deactivation terminal, wherein the first, second and third activation/deactivation terminals are coupled together.

19. The integrated circuit of claim 18 wherein the first activation/deactivation terminal is a set terminal and the second activation/deactivation terminal is a reset terminal.

20. The integrated circuit of claim 18 wherein the bi-stable logic comprises a flip-flop.

21. The integrated circuit of claim 18 wherein the bi-stable logic is configured as an inverting element of the first ring oscillator and as two inverting elements of the second ring oscillator.

22. The integrated circuit of claim 18 wherein the first delay logic comprises a first delay stage coupled to a complimentary second delay stage.

23. A method of generating a clock pulse comprising:
coupling an output of a bi-stable logic to an input of a first delay element through a first path;
coupling the output of the bi-stable logic to an input of a second delay element through a second path;
simultaneously enabling the first delay element, the second delay element and the bi-stable logic;
applying an output signal from the first delay element to a first input of the bi-stable logic; and
applying an output signal from the second delay element to a second input of the bi-stable logic.

24. The method of claim 23 wherein the first path comprises a pair of inverters and the second path comprises an inverter.

25. The method of claim 23, further comprising:
adjusting a delay of the first delay element.

26. The method of claim 25, further comprising:
adjusting a delay of the second delay element.

27. The method of claim 23 wherein simultaneously enabling the first delay element, the second delay element and the bi-stable logic comprises discontinuing a stop signal to a set terminal of the first delay logic and to a reset terminal of the second delay logic.

\* \* \* \* \*